(12) United States Patent
Murai

(10) Patent No.: US 8,410,471 B2
(45) Date of Patent: Apr. 2, 2013

(54) LIGHT EMITTING DEVICE

(75) Inventor: Akihiko Murai, Hioki (JP)

(73) Assignee: Panasonic Corporation, Osaka (JP)

( * ) Notice: Subject to any disclaimer, the term of this patent is extended or adjusted under 35 U.S.C. 154(b) by 142 days.

(21) Appl. No.: 13/141,217

(22) PCT Filed: Dec. 21, 2009

(86) PCT No.: PCT/JP2009/071239
§ 371 (c)(1),
(2), (4) Date: Jun. 21, 2011

(87) PCT Pub. No.: WO2010/074028
PCT Pub. Date: Jul. 1, 2010

(65) Prior Publication Data
US 2011/0248239 A1    Oct. 13, 2011

(30) Foreign Application Priority Data
Dec. 22, 2008    (JP) ................................ 2008-326532

(51) Int. Cl.
*H01L 33/06* (2010.01)
(52) U.S. Cl. ....... 257/13; 257/81; 257/99; 257/E33.008; 257/E33.064; 257/95
(58) Field of Classification Search .................. 257/13, 257/81, 99, 95, E33.008, E33.064
See application file for complete search history.

(56) References Cited

U.S. PATENT DOCUMENTS

| 2004/0026709 | A1 | 2/2004 | Bader et al. |
| 2004/0033638 | A1 | 2/2004 | Bader et al. |
| 2004/0051106 | A1 | 3/2004 | Baur et al. |
| 2004/0056254 | A1 | 3/2004 | Bader et al. |
| 2005/0282373 | A1 | 12/2005 | Bader et al. |
| 2006/0181866 | A1 | 8/2006 | Jung et al. |
| 2006/0284195 | A1 | 12/2006 | Nagai |
| 2007/0042520 | A1 | 2/2007 | Oh et al. |
| 2007/0102721 | A1 | 5/2007 | DenBaars et al. |

FOREIGN PATENT DOCUMENTS

| JP | 62-36561 U | 3/1987 |
| JP | 1-75294 U | 5/1989 |
| JP | 2-134260 A | 5/1990 |
| JP | 2003-16808 A | 1/2003 |
| JP | 2003-532298 A | 10/2003 |
| JP | 2004-517502 A | 6/2004 |
| JP | 2005-109113 A | 4/2005 |
| JP | 2006-229228 A | 8/2006 |
| JP | 2006-351809 A | 12/2006 |
| JP | 2007-53381 A | 3/2007 |
| JP | 2008-4415 A | 1/2008 |
| WO | WO-2007/056354 A2 | 5/2007 |

OTHER PUBLICATIONS

International Search Report for the Application No. PCT/JP2009/071239 mailed Feb. 2, 2010.

*Primary Examiner* — Long Pham
(74) *Attorney, Agent, or Firm* — McDermott Will & Emery LLP

(57) ABSTRACT

A light emitting device includes a substrate, and an LED chip mounted on the substrate. The chip includes: a body comprising a transparent conductor which comprises a base and sticks out of the base to taper off from the base; a light source comprising light emitting parts separately formed on the base; a first terminal formed on the base; and second terminals formed on the light emitting parts, respectively. A conductive pattern of the substrate includes: a first conductor electrically connected with the first terminal; and second conductors electrically connected with the second terminals, respectively.

20 Claims, 2 Drawing Sheets

LIGHT EMITTING DEVICE

TECHNICAL FIELD

The invention relates generally to light emitting devices and, more particularly, to a light emitting device comprising a substrate formed with a conductive pattern on its surface and an LED (light emitting diode) tip which is mounted on the surface of the substrate and electrically connected with the conductive pattern.

BACKGROUND ART

For example, Japanese Patent Application Publication Number 2008-4415 published on Jan. 10, 2008 discloses a light source assembly. This light source assembly has a polyhedron (a square frustum) having faces and LED elements mounted on top and lateral faces of the polyhedron, respectively. Each of the LED elements has anode and cathode electrodes which are electrically connected with conductive patterns formed on the top and lateral faces of the polyhedron through bumps.

In the light source assembly, it is necessary to put the LED elements on the top and lateral faces of the polyhedron, respectively. Therefore, dimensions and part cost of the light source assembly increase, and the work cost also increases by the increase of the mounting work.

Accordingly, if light sources including their own light emitting layers are mounted on the top and lateral faces of the polyhedron in place of the LED elements, the dimensions of the light source assembly can be reduced. However, by putting a light source on one face of the polyhedron, it is not possible to change all or a part of directions to emit light.

DISCLOSURE OF THE INVENTION

An object of the invention is to allow a light source on one face of a body to emit light in a variable direction of all or a part of different directions.

A light emitting device of the present invention comprises: a substrate (1) formed with a conductive pattern (10) on a surface of the substrate; and an LED chip (2) mounted on the surface of the substrate (1) to be electrically connected with the conductive pattern (10). The LED chip (2) comprises a body (3), a light source (4), a first terminal (5) and a plurality of second terminals (6). The body (3) comprises a transparent conductor which comprises a base (30) and sticks out of the base (30) to taper off from the base (30). The light source (4) comprises light emitting parts (40) separately formed on the base (30). The first terminal (5) is formed on the base (30). The second terminals (6) are formed on the light emitting parts (40), respectively. The conductive pattern (10) comprises a first conductor (11) and a plurality of second conductors (12). The first conductor (11) is electrically connected with the first terminal (5). The second conductors (12) are electrically connected with the second terminals (6), respectively.

In this invention, the light emitting parts (40) formed on the base (30) can be individually controlled through the conductive pattern (10), and accordingly it is possible to emit light in a variable direction of all or a part of different directions. That is, the light source (4) on one surface of the body (3) can emit light in a variable direction of all or a part of different directions. Therefore, light distribution control can be realized in a compact size and at a low cost.

In an embodiment, the transparent conductor further comprises one apex (31) and tapers off to the apex (31) from the base (30). The light emitting parts (40) are also arranged around the center of the base (30).

In an embodiment, the transparent conductor is n-type ZnO and has hexagonal crystal structure, and is in the shape of a hexagonal pyramid having the base (30) in the shape of a regular hexagon. The light emitting parts (40) are also located one by one in segmented regions (304) divided by different line segments (303) between the center (300) and outer circumference (301) of the base (30).

In an embodiment, the light emitting parts (40) are located one by one in six segmented regions (304) divided by six line segments (303) between the center (300) and each vertex (302) of the base (30).

In an embodiment, the light emitting parts (40) are located one by one in four segmented regions (304) divided by one diagonal line (305) and two apothems (306) of the base (30), wherein the two apothems (306) are perpendicular to the diagonal line (305).

In an embodiment, each of the light emitting parts (40) comprises: a light emitting layer (42), and p-type and n-type nitride semiconductor layers (41 and 43) placed at both sides of the light emitting layer (42). The p-type nitride semiconductor layers (41) of the light emitting parts (40) are located between the light emitting layers (42) of the light emitting parts (40) and the base (30), respectively, The first terminal (5) comprises one anode electrode (50), while each of the second terminals (6) comprises at least one cathode electrode (60). In this embodiment, an light output can be raised by lowering an occupation area of the anode electrode (50) in the base (30) to increase each area of the light emitting parts (40).

In an embodiment, the anode electrode (50) is located on the central part of the base (30). In this embodiment, distance between the anode electrode (50) and each p-type nitride semiconductor layer (41) can be equalized, in-pane dispersion of a current density in each light emitting part (40) can be reduced, and electric power consumption can be reduced by making a drive voltage low.

In an embodiment, the anode electrode (50) has a plurality of auxiliary electrodes (51), each of which is arranged at a clearance between adjacent light emitting parts (40). In this embodiment, the anode electrode (50) has the auxiliary electrodes (51), and accordingly in-pane dispersion of a current density in each light emitting part (40) can be reduced more, and electric power consumption can be reduced more.

BRIEF DESCRIPTION OF THE DRAWINGS

Preferred embodiments of the invention will now be described in further details. Other features and advantages of the present invention will become better understood with regard to the following detailed description and accompanying drawings where.

BEST MODE FOR CARRYING OUT THE INVENTION

Figure 1:
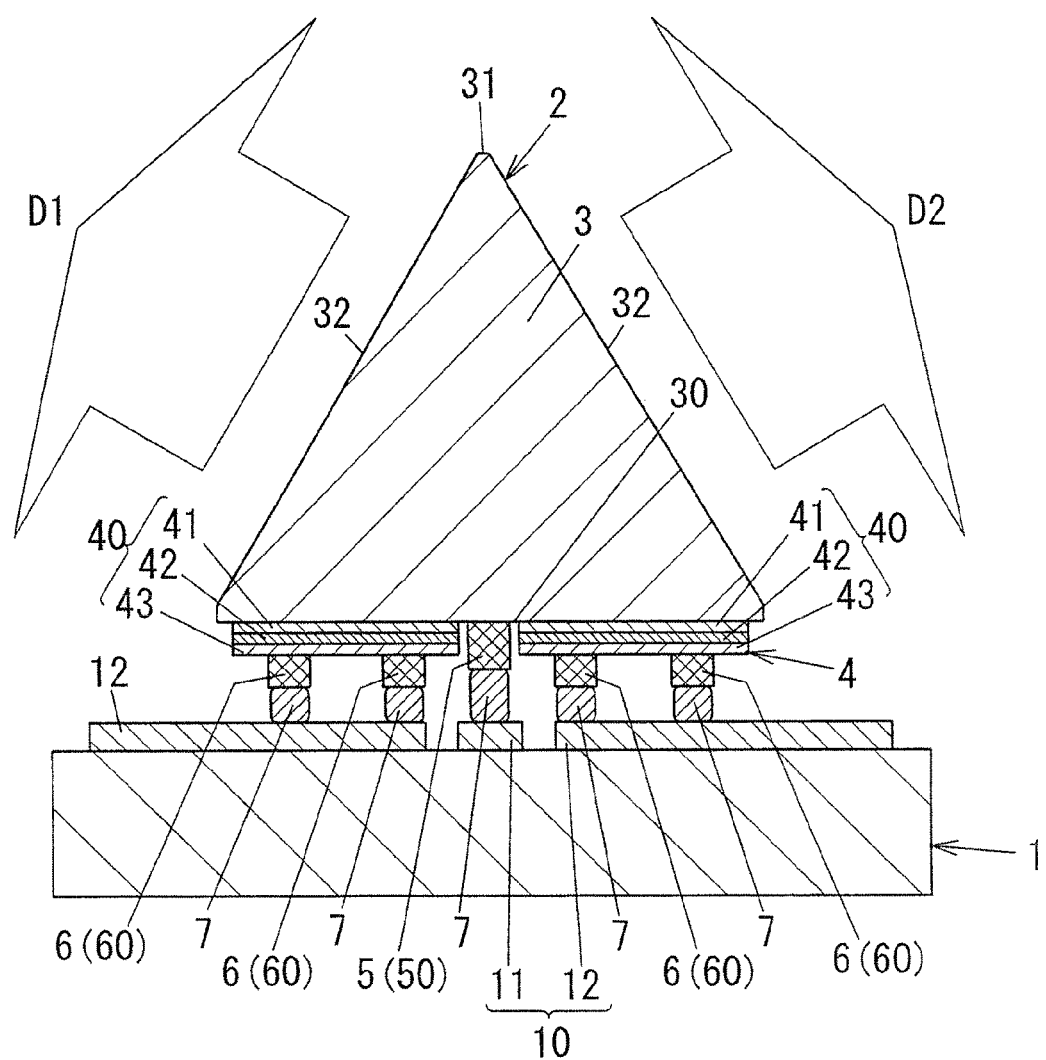
FIG. 1 is a longitudinal sectional view of a light emitting device in accordance with an embodiment of the present invention.
Figure 2:
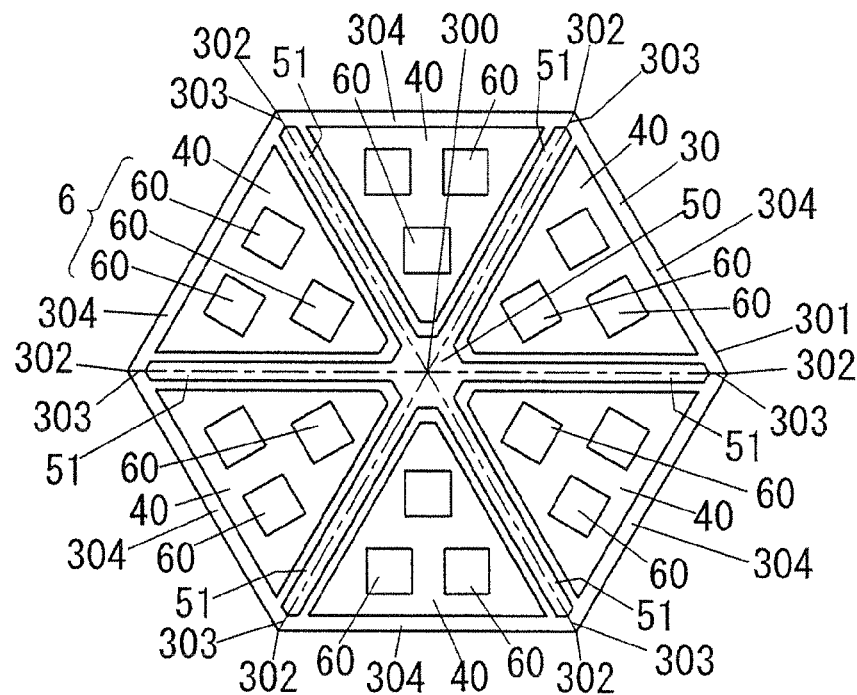
FIG. 2 is a bottom plan view of the light emitting device.

FIGS. 1 and 2 show a light emitting device in accordance with an embodiment of the present invention. This light emitting device includes a rectangular substrate 1 formed with a conductive pattern 10 on its surface and an LED tip 2 which is mounted on the surface of the substrate 1 and electrically connected with the conductive pattern 10.

The substrate 1 is made from thermally-conductive materials (e.g., aluminum nitride), and has electrical insulating properties. The substrate 1 is used as a heat transfer board for transmitting heat from the LED tip 2. Desirably, a silicon substrate formed with an insulating film composed of a silicon nitride film on its surface may be used, and it has the thermal conductivity that is higher than a glass epoxy resin substrate, an alumina substrate or the like.

The conductive pattern 10 includes a first conductor 11 and second conductors 12, and is formed on one side of the substrate 1 (FIG. 1, the top surface). Each of the first conductor 11 and the second conductors 12 is composed of a laminated film of a Cu film, a Ni film and an Au film, and the Au film is the top layer.

The LED tip 2 is composed of a body 3, a light source 4, a first terminal 5 and second terminals 6. The body 3 is composed of a transparent conductor which includes a base 30 and sticks out of the base 30 and tapers off from the base 30. The transparent conductor further includes one apex 31, and tapers off to the apex 31 from the base 30. The transparent conductor is n-type ZnO and has hexagonal crystal structure, and is in the shape of a hexagonal pyramid that has the base 30 in the shape of a regular hexagon.

The light source 4 includes light emitting parts (LED thin film parts) 40 formed on the base 30 separately. For example, the light source 4 includes a thin film structure of GaN emitting a blue light. That is, each light emitting part 40 includes a light emitting layer 42 and p-type and n-type nitride semiconductor layer 41 and 43 placed at both sides of the light emitting layer 42, and the p-type nitride semiconductor layer 41 is located between the light emitting layer 42 and the base 30. More specifically, the p-type nitride semiconductor layer 41 is composed of a p-type GaN layer and a p-type AlGaN layer, and the p-type AlGaN layer is formed between the p-type GaN layer and the light emitting layer 42. The light emitting layer 42 is composed of a InGaN layer. The n-type nitride semiconductor layer 43 is composed of a n-type GaN layer. The light emitting layer 42 and the p-type and n-type nitride semiconductor layers 41 and 43 have the same planar dimensions each. Note that, besides single layer structure, the light emitting layer 42 may have multiple quantum well structure or single quantum well structure.

In an example, the light emitting parts 40 are arranged around the center of the base 30. For example, the light emitting part 40 may be located one by one in segmented regions divided by different line segments between the center 300 and circumference (outline) 301 of the base 30. In this embodiment, (six) light emitting parts 40 are located one by one in six segmented regions 304 divided by six line segments 303 between the center 300 and each vertex 302 of the base 30. Each light emitting part 40 also has the same plane dimensions, and is in the shape of a triangle that is slightly small along a corresponding segmented region 304.

The first terminal 5 is formed on the base 30, and is electrically connected with the first conductor 11 through a bump 7. Because the body 3 is composed of a transparent conductor, the first terminal 5 is electrically connected to each p-type nitride semiconductor layer 41 through the body 3. In the embodiment, the first terminal 5, but not limited to, includes one anode electrode 50 that is placed at the central part of the base 30 as a common terminal. The anode electrode 50 also has (six) auxiliary electrodes 51 located at (six) clearances, respectively, each of which is between adjacent light emitting parts 40 around the center of the base 30. Each auxiliary electrode 51 is separated from light emitting parts 40 at its own both sides.

The second terminals 6 are formed on light emitting parts 40, respectively, and connected to second conductors 12 through bumps 7, respectively. Each bump 7 is made from metal materials (e.g., Au, solder or the like). Each second terminal 6 may include at least one cathode electrode 60. In the example of FIG. 2, three cathode electrodes 60 are included, which are formed on a n-type nitride semiconductor layer 43 as shown in FIG. 1. In brief, the base 30 side of the LED tip 2 is fixed on the conductive pattern 10 of the substrate 1. The larger the number of the bumps 7 (and the cathode electrodes 60) are, the more thermal resistance between the substrate 1 and the LED tip 2 can be reduced, thereby raising radiation performance.

In the embodiment, each of the anode electrode 50 and the cathode electrodes 60 is comprised of a laminated film of an Au film and a Ti film, and the Au film is formed on the base 30. However, not limited to this, the Al film may be intervened between an Au film and a Ti film, or the laminated film may be replaced with a laminated film of an Au film and an Al film.

A production method of the body 3 namely the transparent conductor is now explained. The base 30 provided with the aforementioned layered structure is the main surface of a sapphire wafer, or a c-plane. First, an epitaxial growth layer is formed on the main surface of the sapphire wafer by an epitaxial growth method (e.g., MOVPE method). Then, n light emitting parts 40 are formed by patterning the epitaxial growth layer by photolithography technology and etching technique, where n is given by n1×n2, and n1 is the number of LED tips, and n2 is the number of light emitting parts 40 a tip (e.g., 6). The n light emitting parts 40 are then joined to one n-type ZnO wafer.

Then, in a laser liftoff process, a laser beam is irradiated in the vicinity of an interface between the wafer and each light emitting part 40, and thereby the sapphire wafer is removed. In this approach, the interfacial area with the sapphire wafer per light emitting part 40 can be reduced in comparison with a process for patterning the epitaxial growth layer after removing the sapphire wafer to form each light emitting part 40. Thus, the yield of the process for removing a sapphire wafer can be improved.

Then, n1 Body 3 formed with n2 light emitting parts 40 each are obtained through anisotropic etching using the crystal orientation dependence of the etching speed, using a hydrochloric acid-based etchant solution (e.g., hydrochloric acid water solution). That is, each transparent conductor is made from a n-type ZnO wafer. In the example of this production method, each height of the n1 transparent conductors is defined by the thickness of the n-type ZnO wafer.

In an example, the n-type ZnO wafer is produced by a hydrothermal synthesis method. In the embodiment, the n-type ZnO wafer is, but not limited to, 500 μm in thickness and accordingly each transparent conductor has height of 500 μm. Each transparent conductor (body 3) also has (six) flat sides (lateral faces) 32, each of which has the inclination angle of 60 degrees to the base 30 by the crystalline axis direction of the n-type ZnO wafer.

Specifically, in the n-type ZnO wafer, (0001) plane which is a Zn polar face becomes each base 30 of the transparent conductors. In the aforementioned production method, a mask obtained through appropriate patterning is located at (000-1) plane which is the O polar face at opposite side of (0001) plane. Each transparent conductor is then formed by anisotropic etching of n-type ZnO wafer from the O polar face side. Thereby, each side 32 of each transparent conductor has the inclination angle of 60 degrees to the base 30.

In the embodiment, the light source 4 is formed at the base 30 of the body 3 (transparent conductor), and the base 30 is fixed to the substrate 1, and the light source 4 is electrically connected to the conductive pattern 10 of the substrate 1. Thus, as for a refractive index, ZnO is nearer to GaN than sapphire, and accordingly light extraction efficiency from the LED tip 2 can be raised. For example, with respect to light of wavelength 450 nm, the refractive index of ZnO is 2.1, the refractive index of GaN is 2.4, and the refractive index of sapphire is 1.8.

The light emitting parts 40 formed at the base 30 of the LED tip 2 can be individually controlled through the conductive pattern 10, and accordingly it is possible to emit light in a variable direction of all or a part of different directions such as D1, D2 and the like as shown in FIG. 1. Moreover, the light source 4 is formed only on the base 30 (one surface) of the body 3, and accordingly light distribution control can be realized in a compact size and at a low cost.

In the embodiment, the six light emitting part 40 are placed at the positions corresponding to the six sides (slopes) 32, respectively and accordingly the light source 4 can emit light in a variable direction of all or a part of six different directions. The light emitting devices can be produced to function as a light source smaller than the aforementioned conventional light source assembly, and can function as a point light source smaller than the light source assembly when it emits light in all of the six different directions.

It is also possible to raise an light output by lowering an occupation area of the anode electrode 50 in the base 30 to increase each area of the light emitting parts 40. Distance between the anode electrode 50 and each p-type nitride semiconductor layer 41 can be equalized, in-pane dispersion of a current density in each light emitting part 40 can be reduced, and electric power consumption can be reduced by making a drive voltage low. The anode electrode 50 further has radial shaped auxiliary electrodes 51, and accordingly in-pane dispersion of a current density in each light emitting part 40 can be reduced and electric power consumption can be reduced more.

Figure 3:
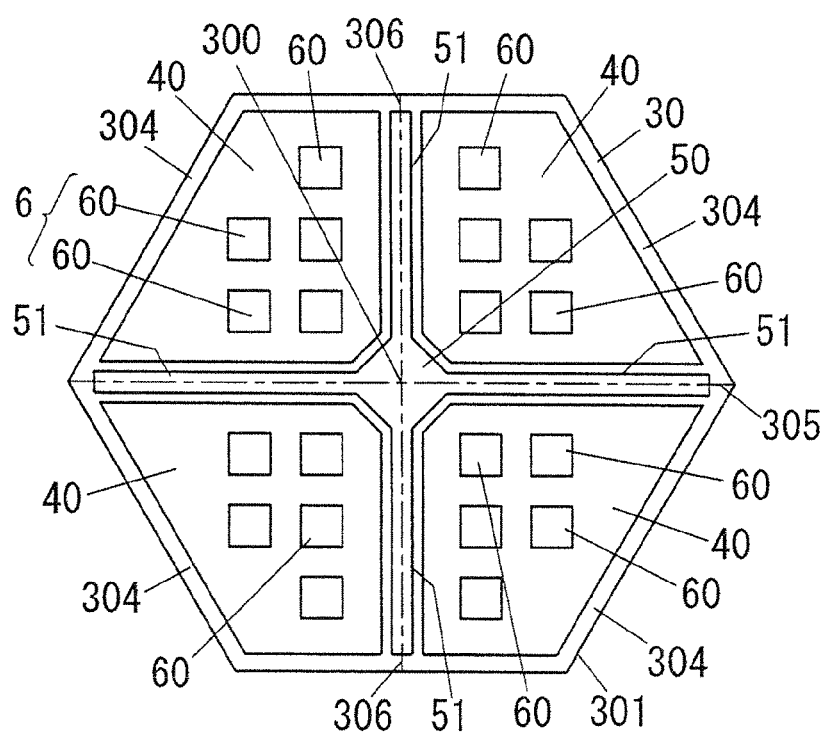
FIG. 3 is a bottom plan view of a light emitting device in accordance with an embodiment of the present invention.

In an embodiment, as shown in FIG. 3, light emitting parts 40 are located one by one in four regions 304 divided by one diagonal line 305 of the base 30 and two apothems 306 perpendicular to the diagonal line 305. Each second terminal 6 also includes, but not limited to, five cathode electrodes 60.

In an embodiment, light emitting parts 40 have different plane dimensions from each other. In an embodiment, light source 4 includes a thin film structure emitting light such as green light, red light, purple light, ultraviolet light, or the like. In an example, each light emitting part 40 may have at least a p-type nitride semiconductor layer 41 and a n-type nitride semiconductor layer, and does not need to include the light emitting layer 40.

Although the present invention has been described with reference to certain preferred embodiments, numerous modifications and variations can be made by those skilled in the art without departing from the true spirit and scope of this invention, namely claims.

The invention claimed is:

1. A light emitting device, comprising:
a substrate formed with a conductive pattern on a surface of the substrate; and
an LED chip mounted on the surface of the substrate to be electrically connected with the conductive pattern,
wherein the LED chip comprises:
a body comprising a transparent conductor, the transparent conductor comprising a base and sticking out of the base to taper off from the base;
a light source comprising a plurality of light emitting parts, the light emitting parts being separately formed on the base;
a first terminal formed on the base; and
a plurality of second terminals, the second terminals being formed on the light emitting parts, respectively,
wherein the conductive pattern comprises:
a first conductor which is electrically connected with the first terminal; and
a plurality of second conductors, the second conductors being electrically connected with the second terminals, respectively.

2. The light emitting device of claim 1,
wherein the transparent conductor further comprises one apex and tapers off to the apex from the base;
wherein the light emitting parts are arranged around the center of the base.

3. The light emitting device of claim 2,
wherein the transparent conductor is n-type ZnO and has hexagonal crystal structure, the transparent conductor being in the shape of a hexagonal pyramid having said base in the shape of a regular hexagon,
wherein the light emitting parts are located one by one in segmented regions divided by different line segments between the center and outer circumference of the base.

4. The light emitting device of claim 3, wherein the light emitting parts are located one by one in six segmented regions divided by six line segments between the center and each vertex of the base.

5. The light emitting device of claim 3, wherein the light emitting parts are located one by one in four segmented regions divided by one diagonal line and two apothems of the base, the two apothems being perpendicular to the diagonal line.

6. The light emitting device of claim 1,
wherein each of the light emitting parts comprises: a light emitting layer; and p-type and n-type nitride semiconductor layers placed at both sides of the light emitting layer,
wherein the p-type nitride semiconductor layers of the light emitting parts are located between the light emitting layers of the light emitting parts and the base, respectively,
wherein the first terminal comprises one anode electrode, while each of the second terminals comprises at least one cathode electrode.

7. The light emitting device of claim 6, wherein the anode electrode is located on the central part of the base.

8. The light emitting device of claim 7, wherein the anode electrode has a plurality of auxiliary electrodes, each of the auxiliary electrodes being arranged at a clearance between adjacent light emitting parts.

9. The light emitting device of claim 2,
wherein each of the light emitting parts comprises: a light emitting layer; and p-type and n-type nitride semiconductor layers placed at both sides of the light emitting layer,
wherein the p-type nitride semiconductor layers of the light emitting parts are located between the light emitting layers of the light emitting parts and the base, respectively,
wherein the first terminal comprises one anode electrode, while each of the second terminals comprises at least one cathode electrode.

10. The light emitting device of claim 3,
wherein each of the light emitting parts comprises: a light emitting layer; and p-type and n-type nitride semiconductor layers placed at both sides of the light emitting layer,
wherein the p-type nitride semiconductor layers of the light emitting parts are located between the light emitting layers of the light emitting parts and the base, respectively,
wherein the first terminal comprises one anode electrode, while each of the second terminals comprises at least one cathode electrode.

11. The light emitting device of claim 4,
wherein each of the light emitting parts comprises: a light emitting layer; and p-type and n-type nitride semiconductor layers placed at both sides of the light emitting layer,
wherein the p-type nitride semiconductor layers of the light emitting parts are located between the light emitting layers of the light emitting parts and the base, respectively,
wherein the first terminal comprises one anode electrode, while each of the second terminals comprises at least one cathode electrode.

12. The light emitting device of claim 5,
wherein each of the light emitting parts comprises: a light emitting layer; and p-type and n-type nitride semiconductor layers placed at both sides of the light emitting layer,
wherein the p-type nitride semiconductor layers of the light emitting parts are located between the light emitting layers of the light emitting parts and the base, respectively,
wherein the first terminal comprises one anode electrode, while each of the second terminals comprises at least one cathode electrode.

13. The light emitting device of claim 9, wherein the anode electrode is located on the central part of the base.

14. The light emitting device of claim 10, wherein the anode electrode is located on the central part of the base.

15. The light emitting device of claim 11, wherein the anode electrode is located on the central part of the base.

16. The light emitting device of claim 12, wherein the anode electrode is located on the central part of the base.

17. The light emitting device of claim 13, wherein the anode electrode has a plurality of auxiliary electrodes, each of the auxiliary electrodes being arranged at a clearance between adjacent light emitting parts.

18. The light emitting device of claim 14, wherein the anode electrode has a plurality of auxiliary electrodes, each of the auxiliary electrodes being arranged at a clearance between adjacent light emitting parts.

19. The light emitting device of claim 15, wherein the anode electrode has a plurality of auxiliary electrodes, each of the auxiliary electrodes being arranged at a clearance between adjacent light emitting parts.

20. The light emitting device of claim 16, wherein the anode electrode has a plurality of auxiliary electrodes, each of the auxiliary electrodes being arranged at a clearance between adjacent light emitting parts.

* * * * *